(12) United States Patent
Loske et al.

(10) Patent No.: US 12,114,439 B2
(45) Date of Patent: Oct. 8, 2024

(54) HOUSING FOR ELECTRONIC COMPONENTS

(71) Applicant: HARTING ELECTRIC STIFTUNG & CO. KG, Espelkamp (DE)

(72) Inventors: Felix Loske, Espelkamp (DE); Markus Friesen, Espelkamp (DE); Christian Vollmer, Espelkamp (DE); Uwe Graeff, Espelkamp (DE)

(73) Assignee: HARTING ELECTRIC STIFTUNG & CO. KG (DE)

( * ) Notice: Subject to any disclaimer, the term of this patent is extended or adjusted under 35 U.S.C. 154(b) by 142 days.

(21) Appl. No.: 17/773,806

(22) PCT Filed: Oct. 19, 2020

(86) PCT No.: PCT/DE2020/100899
§ 371 (c)(1),
(2) Date: May 2, 2022

(87) PCT Pub. No.: WO2021/083455
PCT Pub. Date: May 6, 2021

(65) Prior Publication Data
US 2022/0418121 A1    Dec. 29, 2022

(30) Foreign Application Priority Data

Oct. 31, 2019  (DE) ..................... 10 2019 129 448.7

(51) Int. Cl.
| | |
|---|---|
| H05K 5/00 | (2006.01) |
| H01R 12/71 | (2011.01) |
| H05K 5/02 | (2006.01) |

(52) U.S. Cl.
CPC ........... *H05K 5/0069* (2013.01); *H01R 12/71* (2013.01); *H05K 5/0065* (2013.01); *H05K 5/0247* (2013.01)

(58) Field of Classification Search
CPC .. H05K 5/0247; H05K 5/0204; H05K 5/0069; G06F 1/183
See application file for complete search history.

(56) References Cited

U.S. PATENT DOCUMENTS

| | | | | |
|---|---|---|---|---|
| 4,928,208 A | * | 5/1990 | Volpe .................. | H05K 7/1427 |
| | | | | 361/740 |
| 4,985,845 A | * | 1/1991 | Gotz .................... | H05K 7/1472 |
| | | | | 700/286 |

(Continued)

FOREIGN PATENT DOCUMENTS

| | | | | |
|---|---|---|---|---|
| CN | 204697405 | | 10/2015 | ............... H05K 5/00 |
| CN | 209500789 | | 10/2019 | ............. A63H 33/08 |

(Continued)

OTHER PUBLICATIONS

International Preliminary Report on Patentability issued in PCT/DE2020/100899, dated May 3, 2022, 8 pages.

(Continued)

*Primary Examiner* — James Wu
*Assistant Examiner* — Dakota M Talbert
(74) *Attorney, Agent, or Firm* — HAYES SOLOWAY P.C.

(57) ABSTRACT

A system includes a housing of a printed circuit board arranged in the housing and at least one functional element, wherein the housing has at least one exchangeable side surface, wherein openings which correlate to electrical connections of the printed circuit board are provided in the at least one exchangeable side surface, and wherein the functional elements each pass through an opening in the side surface to the electrical connections of the printed circuit board assigned to them and are connected to said connections.

16 Claims, 1 Drawing Sheet

(56) References Cited

U.S. PATENT DOCUMENTS

| | | | | |
|---|---|---|---|---|
| 5,961,335 A * | 10/1999 | Kubernus | ............ | H01R 9/2658 |
| | | | | 439/713 |
| 6,172,875 B1 * | 1/2001 | Suzuki | ................ | H05K 7/1465 |
| | | | | 361/752 |
| 2006/0035492 A1 | 2/2006 | Sekido | .......................... | 439/100 |
| 2014/0321082 A1 | 10/2014 | Box | ............................. | 361/753 |
| 2015/0098198 A1 | 4/2015 | Drew et al. | .......... | H05K 7/1427 |
| 2016/0134035 A1 | 5/2016 | Hewer et al. | ...... | H01R 12/7005 |

FOREIGN PATENT DOCUMENTS

| | | | | |
|---|---|---|---|---|
| DE | 44 32 509 | 3/1996 | ............ | H02B 1/052 |
| DE | 4432509 A1 * | 3/1996 | ............ | H02B 1/052 |
| DE | 296 18 149 | 12/1996 | ............ | F16H 35/08 |
| DE | 296 18 489 | 8/1997 | ............ | H02G 15/06 |
| EP | 0702441 | 7/1995 | ............ | H02B 1/052 |
| EP | 2 783 423 | 10/2012 | ............ | H01R 12/72 |

OTHER PUBLICATIONS

International Search Report and Written Opinion issued in PCT/DE2020/100899, dated Jan. 27, 2021, with English translation, 19 pages.
German Search Report issued in German Patent Appln. Serial No. 10 2019 129 448.7, dated Sep. 1, 202, with English translation, 5 pages.
Office Action issued in Chinese Patent Appln. Serial No. 202080075989.6, dated Oct. 26, 2023, with machine English translation, 12 pages.

* cited by examiner

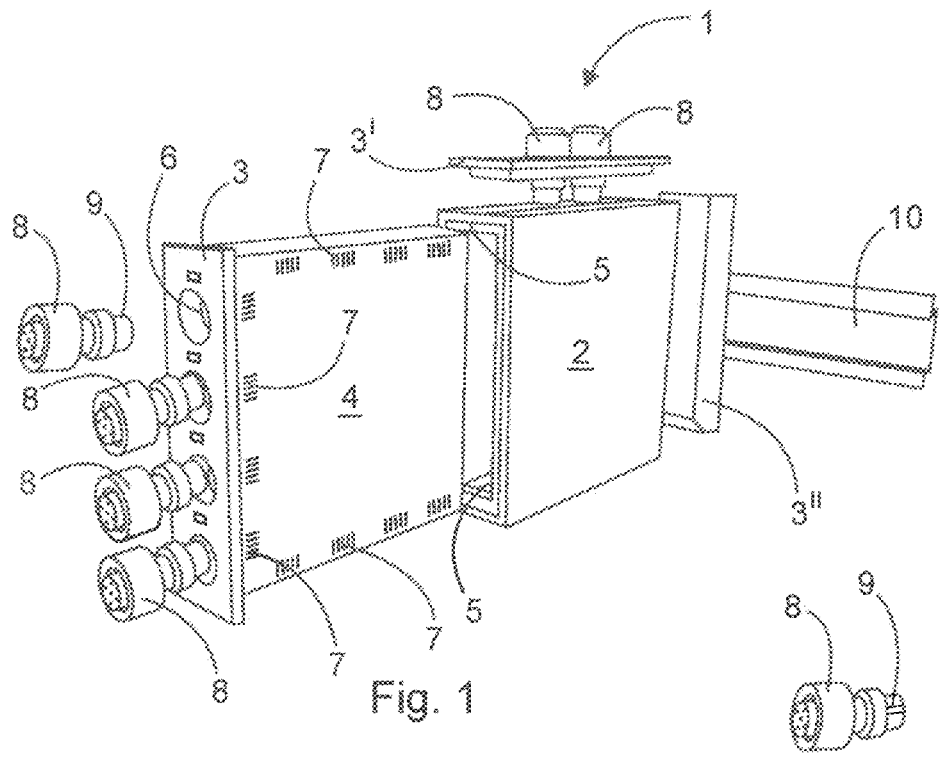
Fig. 1
Fig. 1A
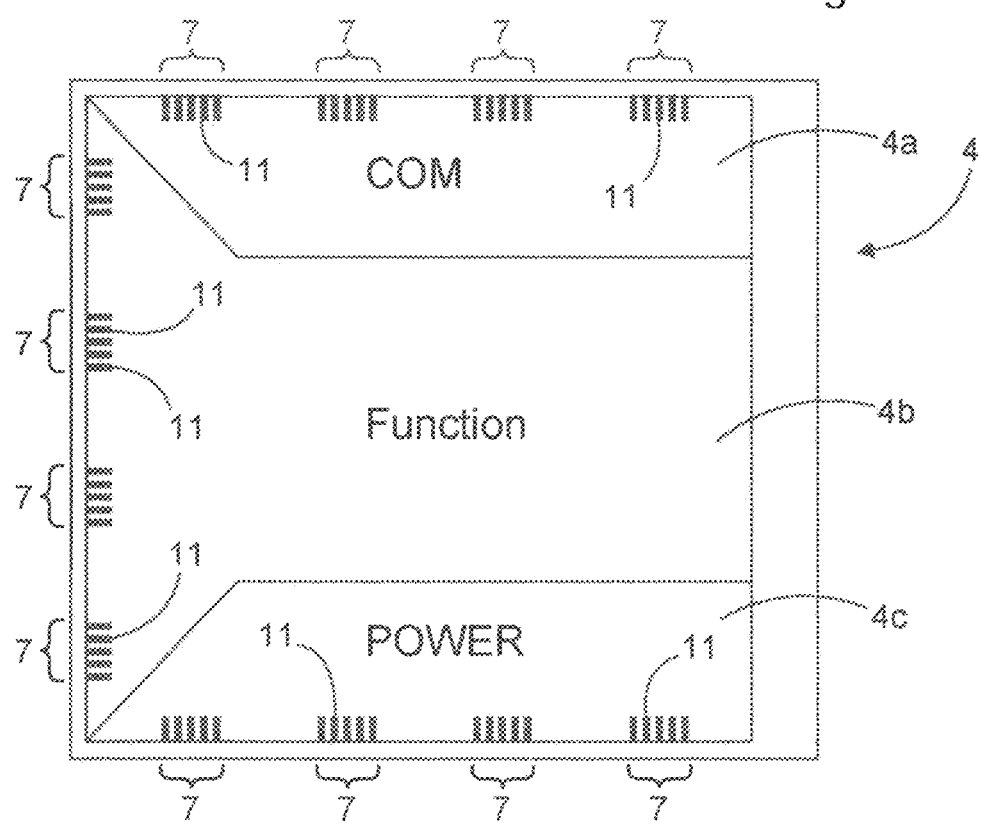
Fig. 2

HOUSING FOR ELECTRONIC COMPONENTS

The invention starts with relates to a system, which comprises electronic components.

Such systems are intended in particular to provide protection for the electronic components embedded therein. The systems are used in particular in industrial environments.

PRIOR ART

DE 296 18 149 U1 discloses a device for converting and/or transmitting optical and/or electrical signals with a connection module for connection to an optical and/or electrical supply network and with an application module, which can be coupled to the connection module in various angular positions, wherein the connection module has a housing with a substantially square footprint, wherein the housing is provided with an assembly plate on the upper side facing the application module, which assembly plate protrudes substantially uniformly over the housing on all sides and has symmetrically arranged fastening elements for fastening the connection module, wherein the assembly plate is formed as a printed circuit board with multi-pin connectors for plugging-on the application module.

EP 2 783 423 B1 discloses a housing in which an electronic printed circuit board is embedded, wherein the electronic printed circuit board comprises a plurality of electrical connections. The electrical connections can be achieved via a plug connector socket in the housing.

In this case, the electrical connections of the printed circuit board must correlate geometrically with the plug connector socket of the housing. The configuration or the design of the printed circuit board is thus limited.

The German Patent and Trademark Office has searched the following prior art in the priority application relating to the present application: DE 296 18 489 U1.

OBJECT

The object of the invention consists in proposing a flexibly usable electronic system for an industrial environment.

The inventive system consists substantially of a housing having at least one changeable side. The housing preferably has a cuboidal, but not cubic, form. A printed circuit board, which can be the main element of an electronic component which is not described in more detail, is arranged in the housing. By way of example, this refers to a sensor system. The printed circuit board is then populated with the corresponding components, in particular sensors. The system further comprises at least one functional element, which in particular forms a plug interface to the printed circuit board or to the electronic component.

The functional element advantageously comprises a plug connector or a plug connector socket, for example a USB socket. The functional element can, however, also have an optical display unit, for example an LED display. The display unit can then visually represent statuses of a system or a device, for example.

Openings, which correlate to electrical connections of the printed circuit board, are provided in the at least one changeable side of the housing.

This means that the electrical connections of the printed circuit board can be accessed through the openings. The at least one functional element can be inserted into the housing through the respective opening in the side and connected to a respective electrical connection of the printed circuit board.

The printed circuit board generally comprises an electronic circuit. The circuit often comprises various sensors, which are connected, circuit-wise, to a control and evaluation unit. The electrical connections of the printed circuit board may also be considered as an interface to the electronic component. The functional elements then in particular form the respective plug interface to the electronic component. The inventive system can thus be integrated in a superordinate system, for example, in particular a machine or industrial plant.

The housing preferably has two to four changeable sides and at least two fixed sides. In the case of the above-mentioned cuboidal form, the two fixed sides preferably refer to the large sides (wide sides), whilst the two to four changeable sides form the smaller sides (narrow sides).

The printed circuit board has a rectangular basic form. The electrical connections for the functional elements are arranged at the edges of the printed circuit board. The electrical connections each consist of a plurality of electrically conductive contact plates, which are mounted on the printed circuit board and are in turn connected to traces of the printed circuit board in an electrically conductive manner. The number of contact plates generally corresponds to the number of contact elements of the associated functional elements. The connection side of the contact elements is pressed onto the respective contact plate in an electrically conductive manner, for example.

The functional elements preferably have, on the connection side, a respective axial slot which extends over or around the associated electrical connection of the printed circuit board. The width of the axial slot is advantageously somewhat smaller than the thickness of the printed circuit board, so that the above-mentioned application of pressure between the connection side of the contact elements and contact plates is realized. The connection side of the contact elements is pressed onto the associated contact plates, whereby a secure conductive connection is produced.

It is advantageous if the changeable sides each have a different number of openings. The number and the position of the openings corresponds to the number and the position of the electrical connections of the printed circuit board which are aligned with respect to the respective side. Depending on the side and the number of openings located therein, the system can be adapted to various printed circuit board designs.

The housing preferably consists of a base frame, which already has the fixed sides (wide side). The different, changeable sides can be fastened to this base frame as required. The fastening can take place via a screw connection, for example.

In an advantageous embodiment of the invention, a changeable side of the housing has a fastening means on the outside, with which the housing can be fastened to a holding profile, for example a top hat rail. A plurality of inventive systems with different electronic components can thus be lined up next to one another on a top hat rail, for example.

A respective groove is preferably incorporated in two opposing sides. The grooves are aligned parallel to one another. The width of the respective grooves corresponds approximately to the thickness of the printed circuit board. The printed circuit board can be slid into the grooves, whereby the printed circuit board is securely held in the system. The grooves extend approximately centrally in the respective sides so that the printed circuit board has the same spacing in each case from the side walls which are parallel to it. The printed circuit board is thus mechanically protected, in particular from vibrations, in industrial environments.

The housing and/or the at least one side is/are ideally made of aluminum. Such a material is light and robust. However, compared to a plastics housing, sufficient conductivity is present so that grounding of the printed circuit board or the components mounted thereon can be optionally performed if necessary.

EXEMPLARY EMBODIMENT

An exemplary embodiment of the invention is illustrated in the drawings and will be explained in more detail below. In the drawings:

FIG. 1 shows a perspective exploded drawing of an inventive system

FIG. 1A is a perspective view showing a functional element rotated so that the slot is visible; and FIG. 2 shows a schematic plan view of a printed circuit board of the system.

The figures contain partially simplified, schematic illustrations. Identical reference signs are sometimes used for elements which are similar, but possibly not identical. Various views of similar elements may be drawn to different scales.

FIG. 1 shows an exploded drawing of an inventive system 1. The system 1 shown here consists of a housing 2, which has two fixed sides and four changeable sides 3, wherein three of these changeable sides 3, 3', 3" are shown spaced from the housing 2 for illustrative purposes.

A printed circuit board 4 is arranged in the housing 2. The printed circuit board 4 is slid into the housing 2 in the grooves 5 incorporated in two opposing side walls and held thereby. The changeable side walls 3, 3' each contain a different number of openings 6. The openings 6 correlate to the electrical connections 7 associated therewith, which are provided circumferentially around the edges of the printed circuit board 4.

Functional elements 8 are connected to the electrical connections 7. The functional elements 8 comprise contact elements, which are not shown in the figures for illustrative reasons. The functional elements 8 each have a slot 9 on the connection side (see FIG. 1A). The respective connection regions of the contact elements are positioned in this slot 9. As a result of sliding the printed circuit board 4 [into] onto the slot 9 of the functional element 8, the connection regions of the contact elements are brought into electrically conductive contact with the contact plates 11 of the respective electrical connections 7. Particularly simple assembly of the system 1 can thus be achieved. The functional elements 8 have circumferential seals, which protect the openings or the system against the penetration of media (water, dust, etc.).

A changeable side 3" is equipped with a fastening means for a top hat rail 10 on the outside. The system, together with further components, can thus be lined up on a top hat rail 10. This is particularly advantageous in the case of large industrial plants or control cabinets.

A printed circuit board 4, which can be used for the inventive system 1, is shown in FIG. 2. The printed circuit board 4 has a rectangular—in this case even square—basic form. The printed circuit board 4 is divided substantially into three functional units 4a, 4b and 4c. The first functional unit 4a represents a communications interface. A data exchange of the system, for example with a superordinate system, is realized hereby. The second functional unit 4b of the printed circuit board 4 contains the essential elements of the system 1. This refers to a sensor circuit, for example. The printed circuit board 4 or the entire system 1 is supplied with the required energy (electric current) via the third functional unit 4c.

Electrical connections 7 for functional elements 8 are arranged at three edges of the printed circuit board 4. The electrical connections 7 each consist of a plurality of contact plates 11. These are each connected to at least one trace of the printed circuit board 4 (not shown for illustrative reasons) in an electrically conductive manner.

Housing For Electronic Components

LIST OF REFERENCE SIGNS

1 System
2 Housing
3 Changeable side
4 Printed circuit board
5 Groove
6 Opening
7 Electrical connection
8 Functional element
9 Slot
10 Top hat rail
11 Contact plate

The invention claimed is:

1. A system comprising: a housing, a printed circuit board arranged in the housing and a plurality of functional elements, wherein
the housing has at least one changeable side
having openings which correlate to electrical connections of the printed circuit board,
wherein the functional elements are configured to extend through the openings in the at least one changeable side and connect to the associated electrical connections of the printed circuit board, wherein each of the functional elements have on a connection side, an axial slot which extends over or around an associated connection of the printed circuit board, wherein a width of the axial slot is smaller than a thickness of the circuit board, and
wherein the printed circuit board has a rectangular basic form, wherein the electrical connections for the functional elements are arranged at edges of the printed circuit board, and wherein the electrical connections each comprise a plurality of contact plates, which are each connected to at least one trace of the printed circuit board in an electrically conductive manner.

2. The system as claimed in claim 1, wherein
the housing has two to four changeable sides and at least two fixed sides.

3. The system as claimed in claim 2, wherein
at least two changeable sides have a different number of openings.

4. The system as claimed in claim 2, wherein
the fixed sides are arranged opposite each other.

5. The system as claimed in claim 2, wherein
at least one changeable side of the housing has a fastener on the outside, with which the housing can be fastened to a top hat rail.

6. The system as claimed in claim 1, wherein
a respective groove, into which the printed circuit board can be slid or inserted, is incorporated in two opposite sides.

7. The system as claimed in claim 1, wherein the axial slot of each of the functional elements extends over the associated electrical connection of the printed circuit board.

8. The system as claimed in claim 1, wherein the housing and/or the at least one changeable side is made of aluminum.

9. The system as claimed in claim 1, wherein the housing has a cuboidal form.

10. The system as claimed in claim 3, wherein the fixed sides are arranged opposite each other.

11. The system as claimed in claim 2, wherein a respective groove, into which the printed circuit board can be slid or inserted, is incorporated in two opposite sides.

12. The system as claimed in claim 2, wherein the axial slot of each of the functional elements extends over the associated electrical connection of the printed circuit board.

13. The system as claimed in claim 2, wherein the housing and/or the at least one changeable side is made of aluminum.

14. The system as claimed in claim 2, wherein the housing has a cuboidal form.

15. The system as claimed in claim 2, wherein the printed circuit board has a rectangular basic form, wherein the electrical connections for the functional elements are arranged at the edges of the printed circuit board.

16. The system as claimed in claim 2, wherein the electrical connections each comprise a plurality of contact plates, which are each connected to at least one trace of the printed circuit board in an electrically conductive manner.

\* \* \* \* \*